(12) United States Patent
Kenney

(10) Patent No.: US 9,120,272 B2
(45) Date of Patent: Sep. 1, 2015

(54) SMOOTH COMPOSITE STRUCTURE

(75) Inventor: Kevin M. Kenney, San Jose, CA (US)

(73) Assignee: APPLE INC., Cupertino, CA (US)

( * ) Notice: Subject to any disclaimer, the term of this patent is extended or adjusted under 35 U.S.C. 154(b) by 345 days.

(21) Appl. No.: 12/959,266

(22) Filed: Dec. 2, 2010

(65) Prior Publication Data
US 2012/0021196 A1 Jan. 26, 2012

Related U.S. Application Data

(60) Provisional application No. 61/366,648, filed on Jul. 22, 2010.

(51) Int. Cl.
| | |
|---|---|
| *B29C 65/48* | (2006.01) |
| *B29C 70/34* | (2006.01) |
| *H05K 5/02* | (2006.01) |
| *B32B 5/02* | (2006.01) |
| *B32B 5/12* | (2006.01) |
| *B32B 5/26* | (2006.01) |
| *B32B 3/26* | (2006.01) |
| *B29C 65/00* | (2006.01) |

(Continued)

(52) U.S. Cl.
CPC ............... *B29C 70/34* (2013.01); *B29C 65/48* (2013.01); *B32B 3/266* (2013.01); *B32B 5/024* (2013.01); *B32B 5/12* (2013.01); *B32B 5/26* (2013.01); *H05K 5/0247* (2013.01); *B29C 66/0222* (2013.01); *B29K 2105/0872* (2013.01); *B29K 2307/04* (2013.01); *B29K 2309/08* (2013.01); *B29L 2031/3481* (2013.01); *B32B 2260/023* (2013.01); *B32B 2262/101* (2013.01); *B32B 2262/106* (2013.01); *B32B 2457/00* (2013.01); *Y10T 156/1002* (2015.01); *Y10T 428/2495* (2015.01)

(58) Field of Classification Search
CPC ...... B29C 65/48; B29C 65/70; B29C 66/022; B29C 66/0222; B29C 66/02224; B29L 2031/3481; H05K 5/0091
USPC .......... 156/182, 214, 245, 312, 323; 264/246, 264/247, 250, 254
See application file for complete search history.

(56) References Cited

U.S. PATENT DOCUMENTS

| | | |
|---|---|---|
| 1,775,813 A | 9/1930 | Colby |
| 1,957,156 A | 5/1934 | Barth et al. |

(Continued)

FOREIGN PATENT DOCUMENTS

| | | |
|---|---|---|
| DE | 10123400 | 2/2002 |
| EP | 1139638 | 10/2001 |

(Continued)

OTHER PUBLICATIONS

Author Unknown, "3M Microspheres Innovative Solutions for Demanding Applications," 3M Innovations, 6 pages, 2004.

*Primary Examiner* — Scott W Dodds
(74) *Attorney, Agent, or Firm* — Brownstein Hyatt Farber Schreck, LLP

(57) ABSTRACT

Certain embodiments disclosed herein relate to a smooth finish composite structure and methods for making the composite structure. In particular, in one embodiment, a method is provided that includes creating a first layer of a composite structure. The creation of the first layer includes positioning the first layer in a mold and curing the first layer. Additional layers of the composite structure are created and bonded to the first layer.

20 Claims, 14 Drawing Sheets

(51) Int. Cl.
*B29L 31/34* (2006.01)
*B29K 105/08* (2006.01)
*B29K 307/04* (2006.01)
*B29K 309/08* (2006.01)

(56) References Cited

U.S. PATENT DOCUMENTS

| | | |
|---|---|---|
| 2,050,901 A | 8/1936 | Sundell |
| 2,638,523 A | 5/1953 | Rubin |
| 2,834,158 A | 5/1958 | Petermann |
| 2,990,616 A | 7/1961 | Kuris et al. |
| 3,131,515 A | 5/1964 | Mason |
| 3,535,955 A | 10/1970 | Stanley et al. |
| 3,802,040 A | 4/1974 | Nomamoto |
| 3,814,016 A | 6/1974 | Leach et al. |
| 3,957,715 A * | 5/1976 | Lirones et al. ............... 523/139 |
| 4,343,846 A | 8/1982 | Kohn |
| 4,353,763 A | 10/1982 | Simons |
| 4,439,298 A | 3/1984 | Ford et al. |
| 4,467,168 A | 8/1984 | Morgan et al. |
| 4,622,091 A * | 11/1986 | Letterman ............... 156/286 |
| 4,934,103 A | 6/1990 | Campergue et al. |
| 4,988,550 A | 1/1991 | Keyser et al. |
| 5,009,821 A | 4/1991 | Weaver |
| 5,052,153 A | 10/1991 | Wiand |
| 5,064,707 A | 11/1991 | Weaver et al. |
| 5,101,599 A | 4/1992 | Takabayasi et al. |
| 5,111,579 A | 5/1992 | Andersent |
| 5,116,138 A | 5/1992 | Macsenti et al. |
| 5,140,773 A | 8/1992 | Miwa et al. |
| 5,237,788 A | 8/1993 | Sandow |
| 5,249,534 A | 10/1993 | Sacks |
| 5,264,992 A * | 11/1993 | Hogdahl et al. ......... 361/679.17 |
| 5,395,682 A | 3/1995 | Holland et al. |
| 5,439,330 A | 8/1995 | Bayer et al. |
| 5,500,164 A | 3/1996 | Livesay et al. |
| 5,503,506 A | 4/1996 | Yuan |
| 5,619,889 A | 4/1997 | Jones et al. |
| 5,755,539 A | 5/1998 | Takeuchi et al. |
| 5,865,569 A | 2/1999 | Holstein et al. |
| 5,879,492 A | 3/1999 | Reis et al. |
| 5,967,357 A | 10/1999 | Kellogg et al. |
| 5,984,600 A | 11/1999 | Gierth |
| 6,117,517 A | 9/2000 | Diaz et al. |
| 6,179,943 B1 * | 1/2001 | Welch et al. ............... 156/160 |
| 6,193,089 B1 | 2/2001 | Yu |
| 6,267,036 B1 | 7/2001 | Lani |
| 6,276,100 B1 | 8/2001 | Woll et al. |
| 6,299,246 B1 | 10/2001 | Tomka |
| 6,435,363 B2 | 8/2002 | Fingerhut et al. |
| 6,437,238 B1 | 8/2002 | Annerino et al. |
| 6,689,246 B2 | 2/2004 | Hirahara et al. |
| 6,703,519 B1 | 3/2004 | Buvat et al. |
| 6,775,908 B2 | 8/2004 | Ohara et al. |
| 6,846,221 B2 | 1/2005 | Ulrich et al. |
| 6,973,815 B2 | 12/2005 | Bryans et al. |
| 7,029,267 B2 | 4/2006 | Caron |
| 7,063,763 B2 | 6/2006 | Chapman, Jr. |
| 7,068,343 B2 | 6/2006 | Saitoh |
| 7,097,371 B2 | 8/2006 | Hasunuma et al. |
| 7,115,323 B2 | 10/2006 | Westre et al. |
| 7,191,555 B2 | 3/2007 | Hughes |
| 7,238,089 B2 | 7/2007 | Tsumuraya et al. |
| 7,326,012 B2 | 2/2008 | Schlotter |
| 7,338,235 B2 | 3/2008 | Weghaus et al. |
| 7,354,350 B2 | 4/2008 | Glimpel |
| 7,393,577 B2 | 7/2008 | Day et al. |
| 7,436,653 B2 | 10/2008 | Yang et al. |
| 7,527,321 B1 | 5/2009 | Benderoth et al. |
| 7,545,628 B2 | 6/2009 | Takuma |
| 7,560,152 B2 | 7/2009 | Rajabali et al. |
| 7,571,828 B2 | 8/2009 | Palley et al. |
| 7,588,970 B2 | 9/2009 | Ohnuma et al. |
| 7,628,879 B2 | 12/2009 | Ackerman |
| 7,710,728 B2 | 5/2010 | Arisaka et al. |
| 7,762,028 B2 | 7/2010 | Valentz et al. |
| 7,790,637 B2 | 9/2010 | DiFonzo et al. |
| 7,934,676 B2 | 5/2011 | Dufresne et al. |
| 7,963,483 B2 | 6/2011 | Roming et al. |
| 7,971,400 B2 | 7/2011 | Boldt et al. |
| 7,988,532 B2 | 8/2011 | Choo et al. |
| 8,021,752 B2 | 9/2011 | Honda et al. |
| 8,023,260 B2 | 9/2011 | Filson et al. |
| 8,031,186 B2 | 10/2011 | Ostergaard |
| 8,042,770 B2 | 10/2011 | Martin et al. |
| 8,096,859 B2 | 1/2012 | Schimweg |
| 8,252,133 B2 | 8/2012 | Feng et al. |
| 8,419,883 B2 | 4/2013 | Day et al. |
| 2002/0195742 A1 | 12/2002 | Beck et al. |
| 2003/0015653 A1 * | 1/2003 | Hansma et al. ............... 250/234 |
| 2003/0078070 A1 | 4/2003 | Hsu |
| 2005/0086916 A1 * | 4/2005 | Caron ............... 55/382 |
| 2005/0097717 A1 | 5/2005 | Rasmussen |
| 2005/0142369 A1 | 6/2005 | Canady et al. |
| 2006/0108058 A1 * | 5/2006 | Chapman et al. ............... 156/245 |
| 2007/0134466 A1 | 6/2007 | Rajaram et al. |
| 2008/0090477 A1 | 4/2008 | Balthes et al. |
| 2008/0094372 A1 | 4/2008 | Philipp |
| 2008/0169380 A1 | 7/2008 | Jackson et al. |
| 2009/0040703 A1 | 2/2009 | Gotham et al. |
| 2009/0041984 A1 | 2/2009 | Mayers et al. |
| 2009/0095523 A1 | 4/2009 | Stevenson et al. |
| 2009/0142157 A1 | 6/2009 | Wang et al. |
| 2009/0208721 A1 | 8/2009 | Tsuchiya et al. |
| 2009/0267266 A1 | 10/2009 | Lee et al. |
| 2010/0024964 A1 * | 2/2010 | Ingram et al. ............... 156/189 |
| 2010/0078254 A1 | 4/2010 | Rolfe et al. |
| 2010/0233424 A1 | 9/2010 | Dan-Jumbo et al. |
| 2010/0289390 A1 | 11/2010 | Kenney |
| 2011/0050509 A1 | 3/2011 | Ayala Vazquez et al. |
| 2011/0180557 A1 | 7/2011 | Kenney |
| 2011/0183580 A1 | 7/2011 | Kenney |
| 2011/0210476 A1 | 9/2011 | Difonzo et al. |
| 2011/0290685 A1 | 12/2011 | Kenney |
| 2012/0003454 A1 | 1/2012 | Younes et al. |
| 2012/0021196 A1 | 1/2012 | Kenney |
| 2012/0147592 A1 | 6/2012 | Takase |
| 2012/0222985 A1 | 9/2012 | Kenney et al. |
| 2013/0148288 A1 | 6/2013 | Kenney |
| 2013/0273295 A1 | 10/2013 | Kenney et al. |

FOREIGN PATENT DOCUMENTS

| | | |
|---|---|---|
| EP | 2047983 | 4/2009 |
| EP | 2051572 | 4/2009 |
| JP | 2006123475 | 5/2006 |
| JP | 2007076202 | 3/2007 |
| JP | 2007186228 | 7/2007 |
| JP | 2010115732 | 5/2010 |
| WO | WO98/15404 | 4/1998 |
| WO | WO2008/133748 | 11/2008 |
| WO | WO2009/017571 | 5/2009 |

* cited by examiner

SMOOTH COMPOSITE STRUCTURE

CROSS-REFERENCE TO RELATED APPLICATIONS

The instant application claims priority to U.S. Provisional Patent Application No. 61/366,648, entitled, "Smooth Composite Structure," filed Jul. 22, 2010, which is incorporated herein by reference in its entirety.

BACKGROUND

1. Technical Field

Embodiments described herein generally relate to a composite structures and, more specifically to composite structures having a smooth surface.

2. Background

Composite structures are used in a variety of applications and have become increasingly common in consumer products. For example, composite structures may serve as housings for electronic devices, such as a notebook computing device housing. However, achieving a high quality outer cosmetic layer in a composite structure can be challenging.

Generally, composite structures, such as a notebook computing device housing, may include multiple layers of unidirectional carbon/epoxy pre-impregnated fiber weave ("prepeg"), such as epoxy used to make carbon fiber reinforced plastic (CFRP). The prepeg is placed in a mold and cured under heat and pressure. The heat causes the viscosity of the epoxy to initially drop, often significantly. As the epoxy cures, the viscosity rises and the epoxy solidifies. During the time when the viscosity of the epoxy is low and the structure is under pressure, the epoxy flows to lower pressure areas (e.g., areas where the mold cavity is larger, areas with gaps or voids, out a parting line of the mold, and so on). This resin flow can change the orientation of the reinforcing carbon fibers and "wash" the fibers in the direction of the resin flow, if the flow is sufficiently fast and/or voluminous. In many cases fibers that are carefully oriented during lay-up will be distorted after molding.

Additionally, defects and/or discontinuities on a mold surface may generally show through on the other side of the structure. This is referred to as "print through." For example, a circular steel plug in a mold surface impacting one side of a structure will generally create a faint circular pattern on the opposite wall of the structure. Similarly, a structure that transitions from four plies to eight plies will typically show four transition lines on the front side of the structure. Ply joints may also print through to a surface layer.

In some cases, it may be desirable to make structures with different materials in specific locations. For example, some computer housings generally made from a carbon and epoxy material use glass/epoxy "windows" in certain parts of the housings to enhance the performance of an antenna behind the window. The transition joint between the glass/epoxy window to the carbon and epoxy housing will generally print through to the housing front side due to thickness differences between the materials, as well as the aforementioned transition issues.

It also may be difficult to achieve a defect-free cosmetic surface when molding composite panels with a foam, balsa, or honeycomb core. This may be due to the core material having inconsistent thickness, absorbing resin at a non-constant rate, uneven pressure applied across the material and so forth.

SUMMARY

A composite structure is provided with a cosmetic surface finish that avoids print through, fiber wash and other issues. The composite structure includes a plurality of plies or layers of carbon/epoxy formed in a stack. An outer layer provides a cosmetic surface finish. In some embodiments, a fine fabric layer is provided on the back of the outer layer to provide structural strength to the outer layer.

The composite structure may be created by placing the outer layer in a mold, such as a cavity mold, and curing the outer layer with heat and pressure. The pressure and heat may be provided by techniques known in the art. In some embodiments, the pressure may be provided by a vacuum bag, air bladder, silicone mandrel, or other method of generating pressure. In some embodiments, the outer layer may be formed with a peel ply. After the outer layer has cured, the peel ply may be removed to provide a surface for bonding with other layers of the composite structure.

In some embodiments, the outer layer may remain in the mold after curing and additional layers may be added into the mold over the outer layer. In some embodiments, an adhesive layer, such as film adhesive, may be provided to aid in bonding the additional layers to the outer layer. The additional layers are cured through heat and pressure and are bonded to the outer layer to form the composite structure.

In some embodiments, the outer layer and additional layers may be formed separately and subsequently joined together. In particular, the outer layer may be cured and then removed from the mold, the additional layers may be cured and removed from their mold and then the outer layer and additional layers may be bonded together. The bonding of the outer layer and the additional layers may be achieved through a suitable bonding process. For example, in some embodiments, a film adhesive, a contact cement, and/or a liquid adhesive may be provided in between the outer layer and the additional layers. Additionally, heat and/or pressure may be provided to bond the outer layer to the additional layers.

In some embodiments, an area may be removed or cutout from underlying layers in a composite structure. The removed area may be replaced with a glass, plastic, or epoxy to provide for an antenna window. A cosmetic layer is bonded to the underlying layers to cover the underlying layers and, thus, obscure the window. The cosmetic layer is created in a separate curing process from the underlying layers so that it may appear unblemished.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Certain aspects of the present disclosure relate to composite structures, surface finishes for such structures, and methods for creating the same. Generally, "composite structures" may refer to structures made from carbon fiber reinforced plastic (CFRP), other fiber-in-matrix materials, and/or other composite materials. The material may be used in consumer electronic products as a housing, among other things. In some embodiments, an outer layer of a composite structure is cured independently from other layers of the composite structure. A woven fabric may be provided with the outer layer in some embodiments to provide structural support for the outer layer.

As used herein, the terms "ply" and "plies" refer to layers of a composite structure such as carbon fiber layers, glass fiber layers, and so forth. As such, the terms "ply" and "plies" may be used interchangeably herein with the terms "layer" and "layers". Moreover, in some embodiments, a composite structure may be created using materials that are not generally provided in a layered or ply form. For example, composite structures may be created from molding compounds, plastics, and/or other similar materials, that may be provided in shapes or forms other than layers. Hence, it should be appreciated that although specific embodiments may employ layering of composite materials, the techniques may apply to other types or forms of composite structures.

In certain embodiments, an outer layer of a housing or other composite structure formed from a composite material is cured independently from other layers, thereby providing a cosmetic finish to the outer layer that is free from fiber wash or print through. Molding the outer layer as a separate operation from the remainder of the composite structure allows for molding parameters to be modified to improve cosmetic appearance. For example, low/zero flow resin systems can be used for this layer while other systems may be used for the remaining structure. Additionally or alternatively, molding and curing parameters, such as pressure and temperature may be modified for this layer without regard to structural performance, as the other layers of the composite structure may be formed with consideration for structural performance. Additionally, as the outer layer provides the cosmetic finish, the other layers may be molded with little or no consideration for cosmetic effects.

Figure 1:
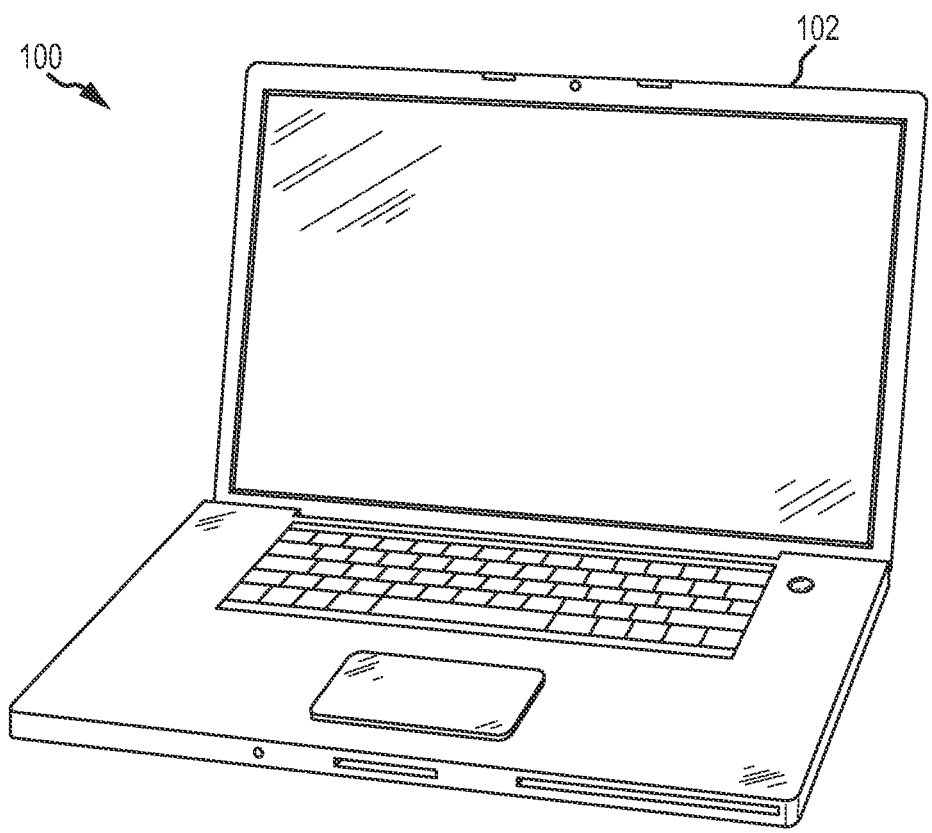
FIG. 1 illustrates a notebook computing device having a composite structure for a housing.

Turning to the figures and referring initially to FIG. 1, a notebook computing device 100 having a housing 102 made of a composite material is illustrated. It should be appreciated that the housing 102 is presented as an example and composite materials and structures may be implemented in a variety of different applications. Indeed, various exemplary embodiments and techniques described herein should be understood as non-limiting examples to which changes or modifications may be made without departing from the spirit or scope of the disclosure. Accordingly, the various embodiments, methods and configurations disclosed herein should not be interpreted as limiting.

Figure 2:
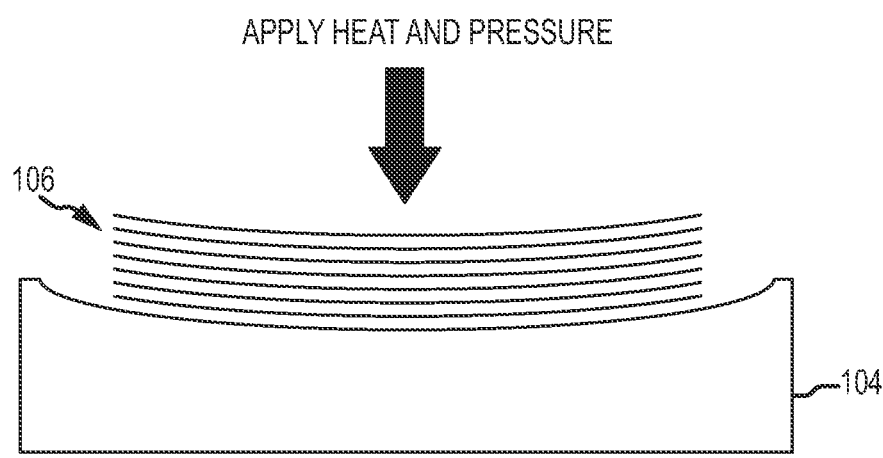
FIG. 2 illustrates a conventional composite structure.

Generally, the housing 102 may be formed of multiple layers of composite or other material. FIG. 2 illustrates a traditional technique for forming a housing, such as housing 102. Specifically, various plies 106 of composite material are positioned within a mold 104 and heat and pressure are applied to the plies to cure the plies into a composite structure. The composite structure generally may take a form of the mold 104. However, as mentioned previously, issues such as fiber wash and print through may cause discontinuity in an outer surface of the composite structure.

Figure 3:
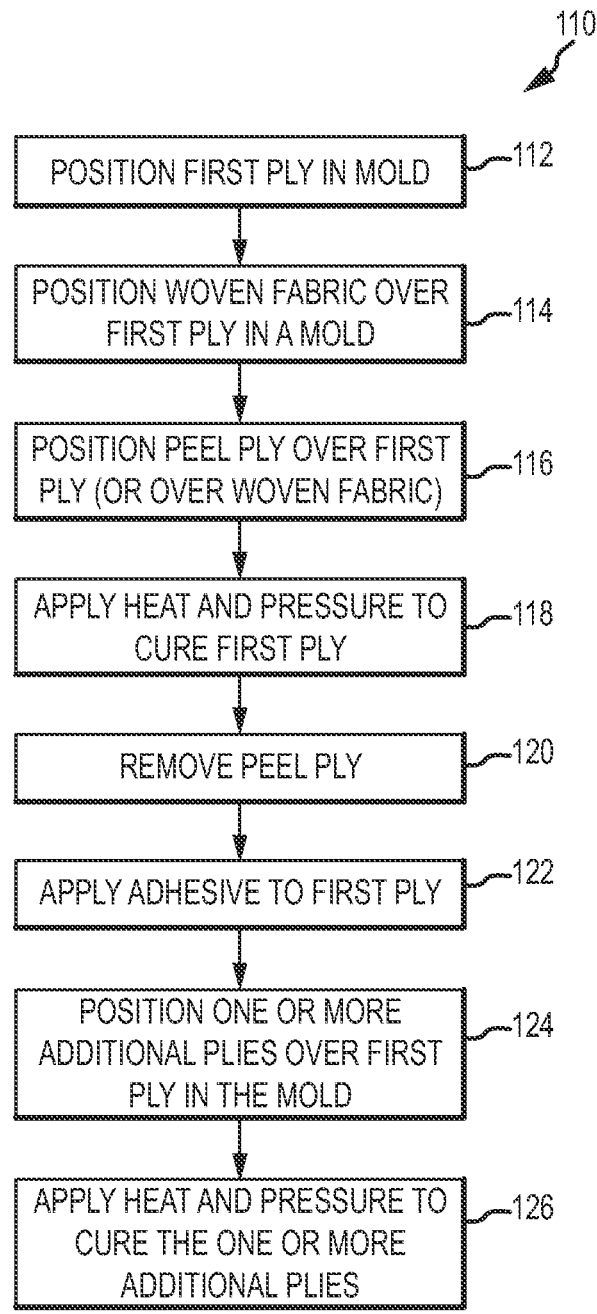
FIG. 3 is a flowchart illustrating a method for creating a composite structure having a cosmetic surface finish.

FIG. 3 is a flowchart 110 illustrating an example method for creating a composite structure having a surface finish without discontinuities resulting from print through, fiber wash, and the like, or with such discontinuities reduced when compared to traditional creation methods. Initially, a first ply is positioned in a mold (Block 112). In some embodiments, a woven fabric may be positioned over the first ply (Block 114) to provide structural support to the first ply. Additionally, in some embodiments, a peel ply may be positioned over the first ply (or the woven fabric, if used) (Block 116). The first ply is cured by applying heat and pressure (Block 118). Once cured, the peel ply may be removed (Block 120) and an adhesive may be applied to the first layer (or to the woven fabric, if used) (Block 122). One or more additional plies may then be positioned within the mold over the first ply (Block 124) and the one or more additional plies cured using heat and pressure (Block 126) to form a composite backing.

In some embodiments, the curing of the first ply (Block 118) may occur at temperatures and pressures that differ from those used to cure the one or more additional plies (Block 126). The use of different pressures and temperatures allow for the first ply to be custom cured to provide a desired finish. Furthermore, the one or more additional plies may be custom cured to provide a desired structure. That is the one or more additional layers may be cured at temperatures and pressure that provide a desired structural strength for the composite structure as well as desired features and/or shapes in the structure.

Figure 4:
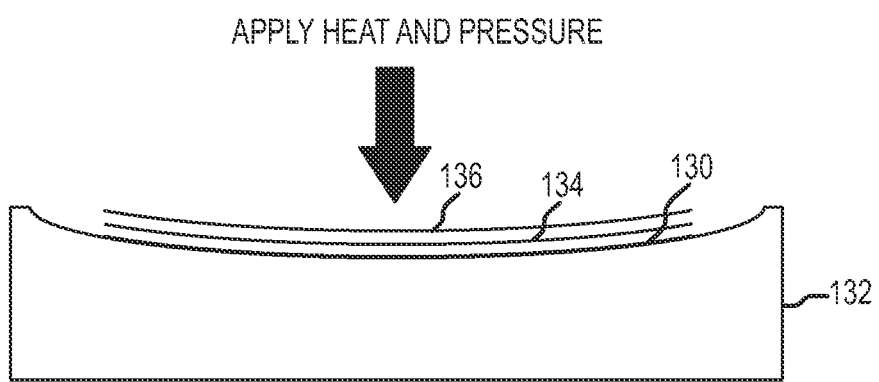
FIG. 4 illustrates an operation for curing an outer layer to serve as a cosmetic surface for a composite structure.
Figure 5:
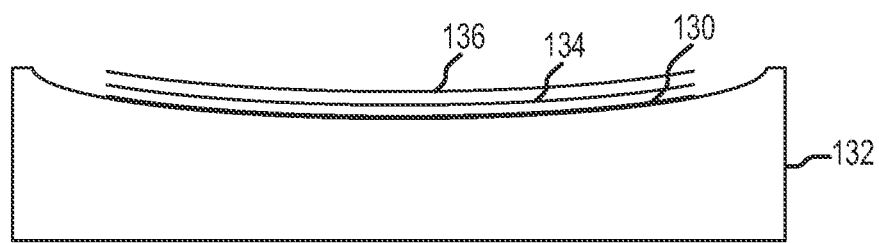
FIG. 5 illustrates an operation for removal of a peel ply in preparation for adding more plies. to the composite structure of FIG. 4.
Figure 6:
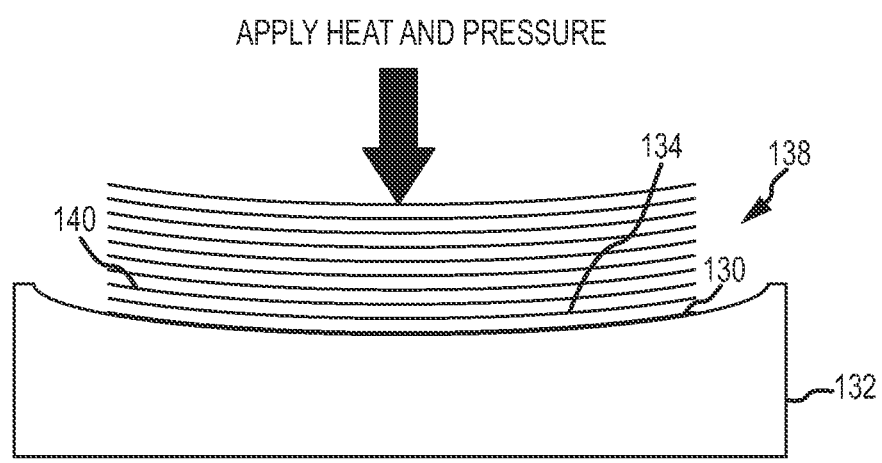
FIG. 6 illustrates an operation for the stacking of additional plies to the composite structure of FIG. 4 and curing and bonding the additional plies.

FIGS. 4-6 graphically illustrate an example of the method of the flowchart 110. Specifically, FIG. 4 shows a layer of carbon prepeg 130 positioned within a mold 132. The carbon prepeg layer 130 may be carbon fiber reinforced plastic (CFRP), other fiber-in-matrix materials, or other composite materials, including carbon fiber impregnated with epoxy resin. In some embodiments, the carbon prepeg layer 130 may be unidirectional, such that impregnated fibers extend along the same axis.

A layer of glass fabric prepeg 134 and a peel ply 136 are positioned over the layer of carbon prepeg 130. The glass fiber layer 134 may be a woven fabric formed from glass fabric, can be relatively thin, and may be approximately less than ⅓ the thickness of the carbon prepeg layer 130 (or approximately 0.033 mm or less). For example, in some embodiments, a very fine fabric such as style 104 may be used. "Style 104" refers to a particular woven fiberglass fabric that is less than about 0.04 mm thick and weighs about 0.6 ounces/yard, as known in the art. In other embodiments, other types of material may be used such as a fine gauge mesh, a polyester fabric, and so forth that will not print through the carbon prepeg layer. Generally, the fibers in the glass fiber prepeg 134 are oriented at 0 and 90 degrees. This woven pattern may aid in stabilizing fibers in the carbon prepeg layer 130 to help prevent fiber wash by restraining flow with glass fiber. Additionally, the glass fiber prepeg 134 provides structural support to the carbon prepeg layer 130.

The peel ply 136 may be applied over the glass fabric prepeg 134. The peel ply 136 prepares the glass fabric prepeg 134 (or the carbon prepeg 130 when the glass fabric is not used) for bonding of additional layers. Specifically, the removal of the peel ply 136 leaves a fabric pattern on the surface to which it was attached. The remaining fabric pattern provides a surface with bonding features (i.e., a rough surface with greater surface area). FIG. 5 illustrates the peel ply 136 being removed. The peel ply 136 has a release agent to help facilitate removal of the peel ply after the carbon prepeg layer 130 has been cured through heat and pressure.

FIG. 6 illustrates the stacking of additional layers 138 on the glass fabric prepeg 134 and creation of the overall composite structure. A film adhesive 140 to bond the additional layers to the carbon prepeg 130 during the curing of the additional layers with heat and pressure to form a composite structure. Specifically, additional layers 138 are stacked on top of the film adhesive 140 which is positioned over the glass fabric prepeg 134. The pressure and/or heat applied during the curing process bonds the additional layers to the glass fabric prepeg 134 (or the carbon prepeg layer 130 when no woven fabric is used).

The bonding of the additional layers 138 to the carbon prepeg 130 forms a composite structure that may have a surface finish devoid of discontinuities, as the carbon prepeg was cured separately from the additional layers. The composite structure may be used for various applications such as the housing 102 of the notebook computing device 100 of FIG. 1.

Figure 7:
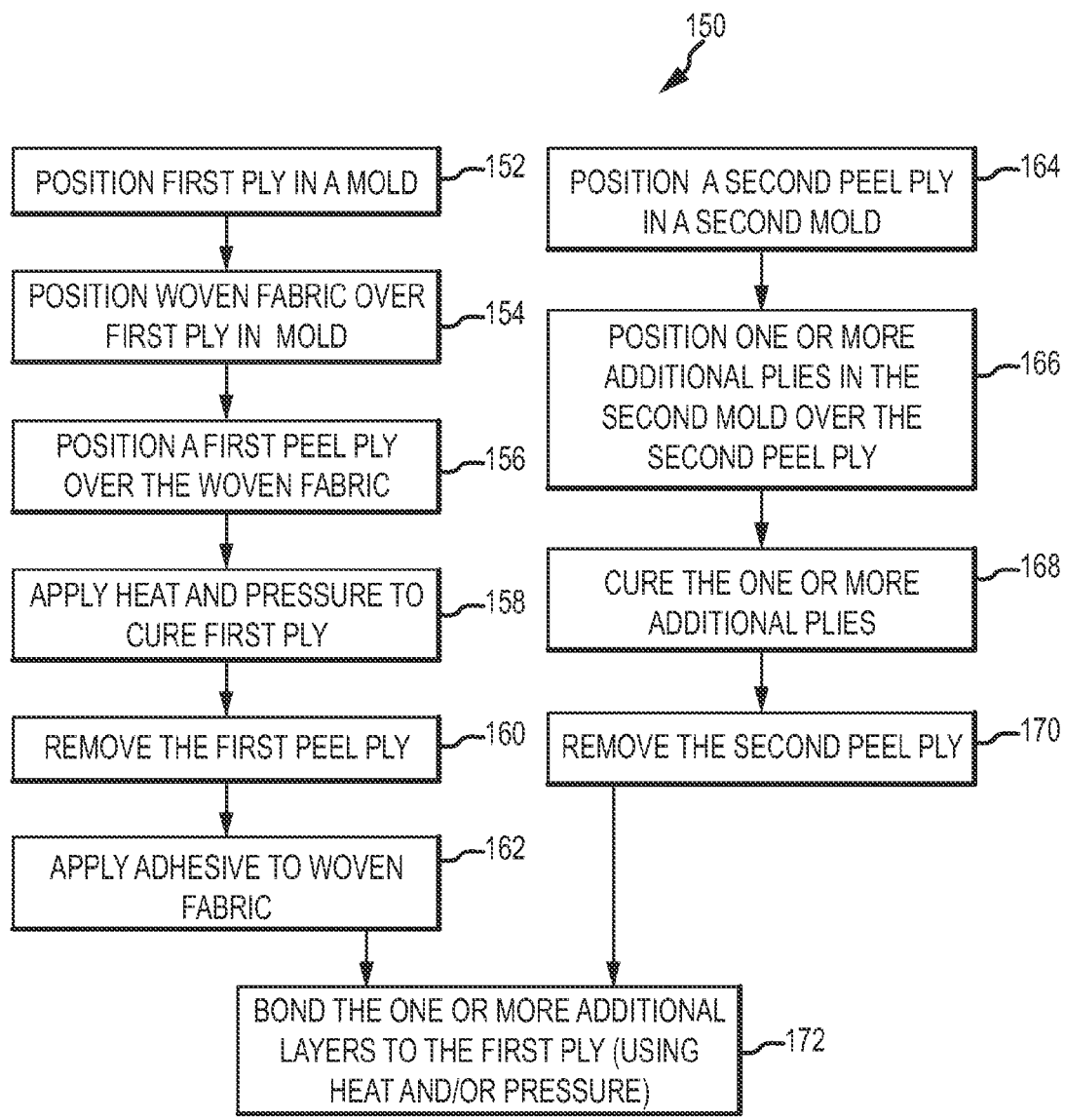
FIG. 7 is a flowchart illustrating an alternative method for creating a composite structure having a cosmetic surface finish.

Alternative techniques may also be employed to form a composite structure having a smooth or defect-free surface finish. In particular, FIG. 7 is a flowchart 150 illustrating an example method for creating a composite structure having a surface finish in accordance with an alternative embodiment. The method illustrated in flowchart 150 includes the operation of curing the first, outer layer and an inner structure in separate molding operations. Generally, with respect to the first ply, the method may include steps similar to those discussed above in the flowchart 110 of FIG. 3. That is, the first ply is positioned in a mold (Block 152), a woven fabric may be positioned over the first ply (Block 154), a first peel ply may be positioned over the woven fabric (Block 156) and the first ply is cured using heat and pressure (Block 156). The method also includes removing the first peel ply (Block 160) and applying an adhesive to the woven fabric (Block 162). The adhesive may take the form of a film adhesive, contact cement, liquid adhesive, and/or the like.

Simultaneously, one or more additional plies may be positioned in another mold for curing. In some embodiments, a peel ply may first be positioned in a second mold (Block 164) and the one or more additional plies may be stacked over the peel ply (Block 166). In other embodiments, a peel ply may not be used. After the one or more additional plies are positioned in the second mold, they are cured using heat and pressure (Block 168) to form a composite backing. The composite backing is removed from the second mold and the second peel ply is then removed from the composite backing (Block 170).

Once both the first ply and the composite backing have cured, and the first and second peel plies removed, the composite backing and the first layer are bonded together using heat and/or pressure (Block 172). In an alternative embodiment, the composite backing may be cured in the same mold as the first layer. Thus, the one or more layers are not cured simultaneously with the first layer. In another alternative embodiment, a single peel ply is used. That is, the first or second peel ply is used. In yet another embodiment, the first peel ply is positioned on the first ply and no woven fabric is used. In another alternative embodiment, no adhesive is used.

Figure 8:
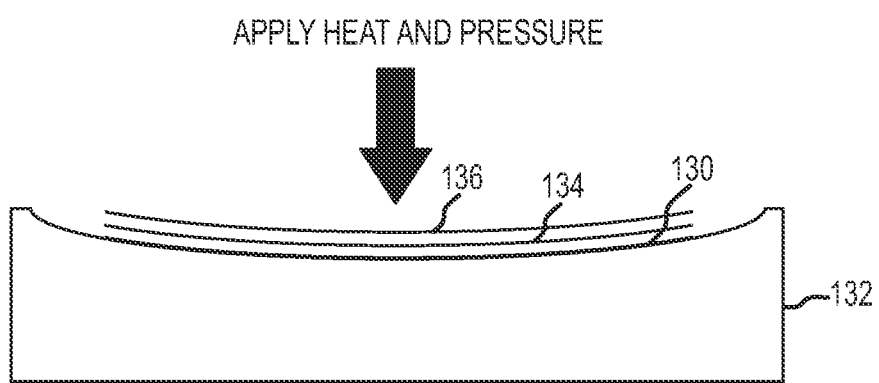
FIG. 8 illustrates an operation for curing an outer layer to serve as a cosmetic surface for a composite structure.
Figure 9:
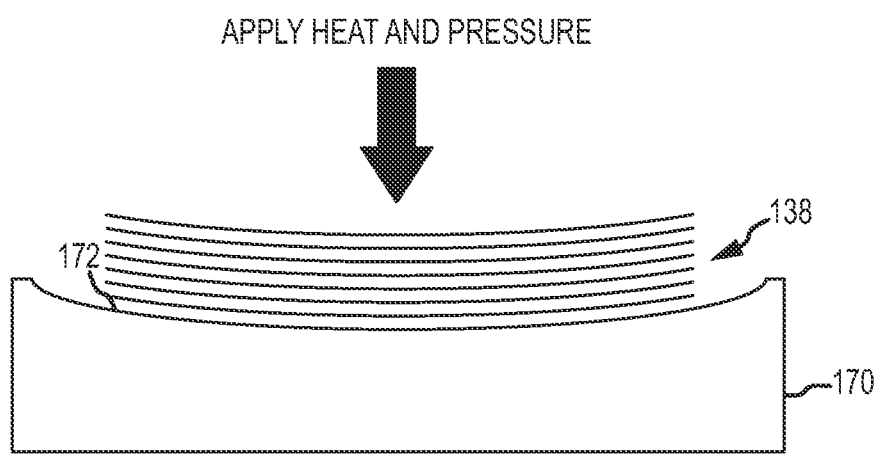
FIG. 9 illustrates an operation for curing additional layers separately from the outer layer of FIG. 8.
Figure 10:
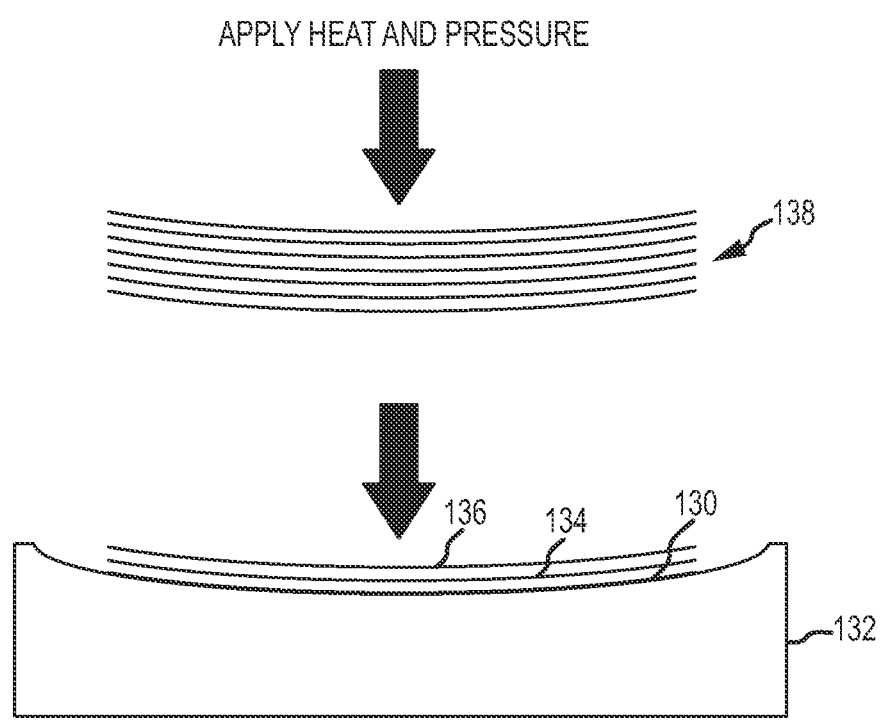
FIG. 10 illustrates an operation for bonding the outer layer of FIG. 8 with the additional layers of FIG. 9 to form a composite structure.

FIGS. 8-10 graphically illustrate an example of the method of the flowchart 150. Specifically, FIG. 8 shows the layer of carbon prepeg 130 positioned within the mold 132 with the layer of fabric prepeg 134 and peel ply 136 stacked on top of the carbon prepeg layer. Additionally, FIG. 8 shows heat and pressure being applied to cure the carbon prepeg layer 130.

FIG. 9 illustrates the additional layers of carbon prepeg 138 positioned within a second mold 170 in a separate operation from the curing of the carbon prepeg 130. A second peel ply 172 is positioned in the second mold 170 under the additional layers of carbon prepeg 138. Heat and pressure are applied to cure the additional layers 138.

FIG. 10 illustrates the additional layers 138 being bonded to the carbon layer 130. The bonding is achieved by removing the peel ply 136 from the glass fabric prepeg 134 and the second peel ply from the additional layers 138, applying a bonding material 139 to the glass fabric prepeg, positioning the additional layers on the glass fabric prepeg and applying pressure and/or heat.

The first layer (or carbon prepeg layer 130) may primarily be implemented as a cosmetic layer while the additional layers may primarily be implemented as structural layers. By molding the first layer and the additional layers separately, the molding parameters may be customized to achieve a desired result. For example, low or zero flow resin systems can be used for the first layer, such as a lower pressure system. As such, the system may be optimized to achieve a particular look without regard to the first layer's structural performance, while the additional layers may be molded with little consideration for cosmetic effects. As such, it should be appreciated that the example embodiments presented herein may be changed or modified to achieve a particular purpose without departing from the scope of the disclosure.

Figure 11:
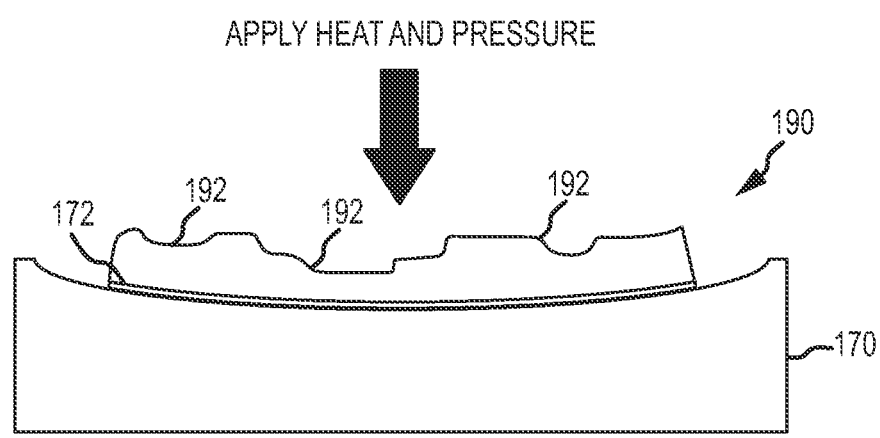
FIG. 11 illustrates a composite structure formed with chopped epoxy that may be bonded to the outer layer of FIG. 8.

For example, in some embodiments, the composite backing may be formed with chopped compression molding compound such as TenCate MS-4A, bulk molding compound, sheet molding compound, thermoformed thermoplastic composites, injection molded plastic, resin transfer molding, or other similar material. The chopped compression molding compound may be molded and cured to form particular shapes that may be difficult to achieve using conventional composite layering. FIG. 11 illustrates a composite structure 190 that may be cured to have a particular shape. As shown, the composite structure 190 may have features 192 that may be used to accommodate particular components or to provide a desired effect, such as an acoustical or venting effect, for example.

The composite structure 190 may be bonded to a cosmetic layer such as the carbon prepeg layer 130 of the prior examples to form a composite structure having a surface finish. As such, the composite structure may be formed without particular attention or concern for cosmetic appearance. Rather, it may be formed with particular structural parameters and/or to provide for internal recesses or shapes to provide for component clearance.

Thus, by curing a cosmetic layer separately in an operation independent from the curing of other layers of a composite structure, superior cosmetic appearance may be achieved relative to conventional techniques. In particular, molding the outer layer as a separate operation enables the optimization of the cosmetic properties of the structure and does not allow defects, features, ply drops, or other anomalies to print though and affect the cosmetic layer. Hence, antenna windows, wires, metal bosses, and other features may be built into the structure without affecting the cosmetic layer's appearance.

Figure 12:
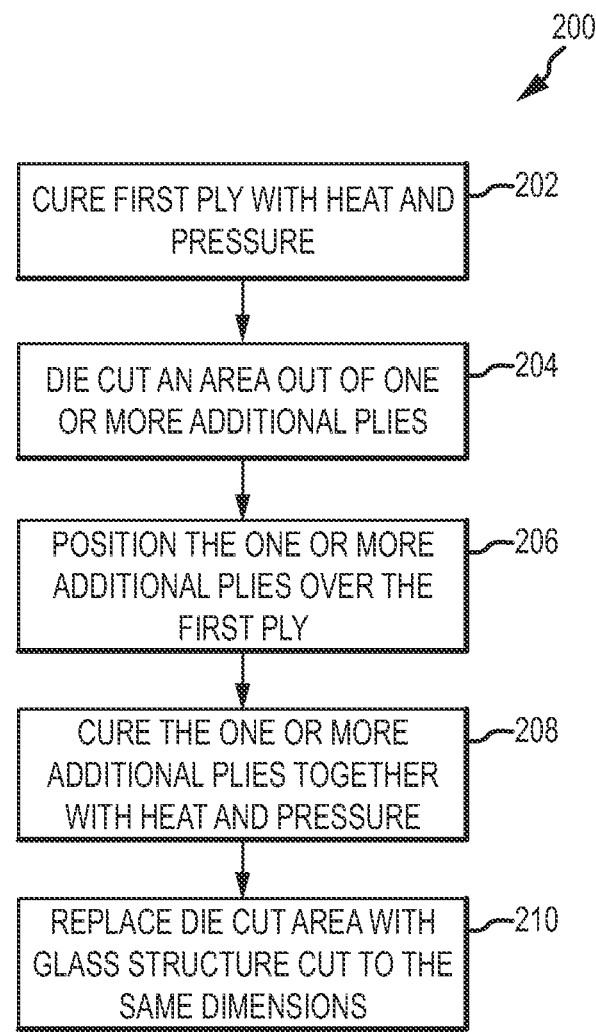
FIG. 12 is a flow-chart illustrating a method for creating a smooth composite structure having a window within the structure.

FIG. 12 is a flow chart illustrating an example method 200 for providing an antenna window within the composite structure. A first ply may be cured with heat and pressure (Block 202), as with above-mentioned techniques. A specified area of one or more other plies maybe die cut to provide for an antenna window (Block 204). The one or more additional plies are then positioned over the first ply (Block 206) and cured with pressure and heat (Block 208). It should be appreciated, that additional steps may be included in an actual implementation. In particular, a bonding agent, such as glue may be positioned between the first layer and other layers. Additionally, techniques such as those described above maybe implemented to condition the surface of the first ply for bonding.

After the other ply layers have been cured, a glass/epoxy window cut to the same dimensions is placed within the die cut area of the other plies (Block 210). In some embodiments, the glass/epoxy window may be positioned within the die cut area of the other plies before heat and pressure are applied.

Figure 13:
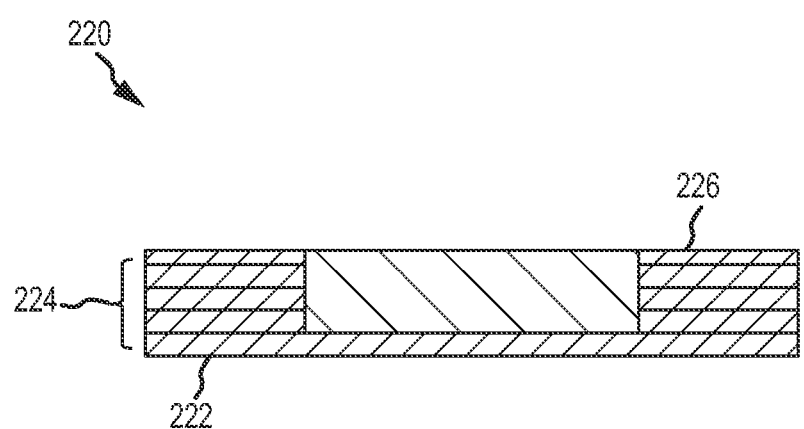
FIG. 13 is a cross-sectional view of a composite structure having a window within the structure.

FIG. 13 is a cross-sectional view of a composite structure 220 that includes an antenna window. The composite structure 220 may be formed in accordance with the method 200 so that an outer ply 222 is smooth. That is, the outer ply 222 is cured separately from the other plies 224. Thus, the positioning of a glass window 226 within the composite structure does not print through the outer layer and the antenna window is invisible outside the housing.

Figure 14:
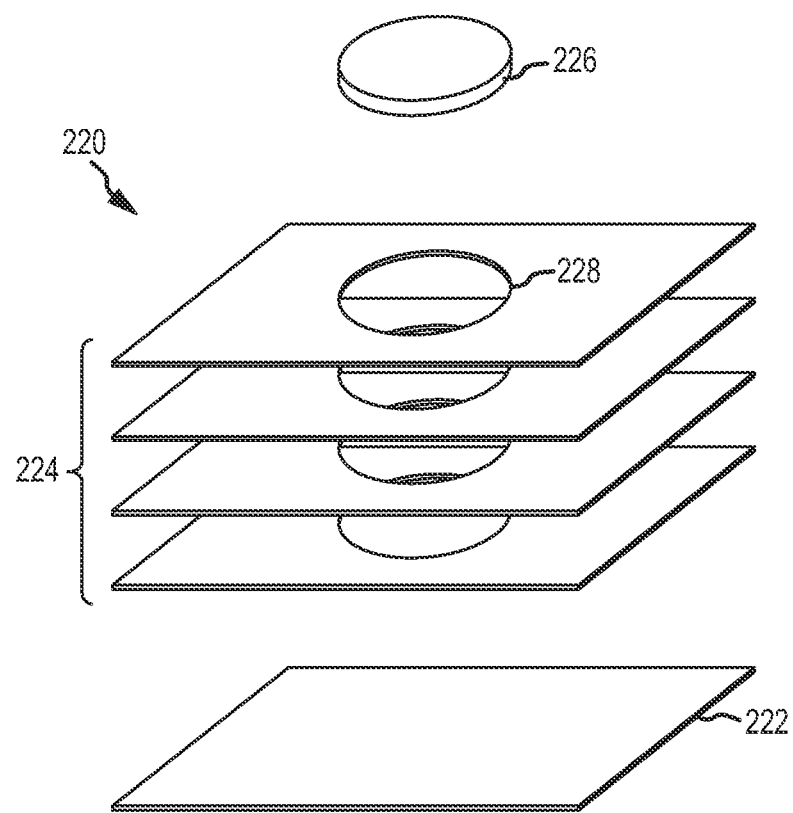
FIG. 14 is an exploded view of the composite structure of FIG. 13.

FIG. 14 illustrates an exploded view of the composite structure 220. As may be seen, the outer ply 222 is without blemish, whereas, each of the other plies 224 have an area 228 removed therefrom. It should be appreciated, that the area removed and the glass//epoxy window that replaces the removed area may take any suitable shape.

The foregoing describes some example embodiments for creating a composite structure with a smooth, cosmetic outer layer to improve aesthetic appeal, particularly in cases where there are joints, or incongruities in the composite structure. Although specific embodiments have been described, persons skilled in the art will recognize that changes may be made in form and detail without departing from the spirit and scope of the embodiments. Accordingly, the specific embodiments described herein should be understood as examples and not limiting the scope of the disclosure.

The invention claimed is:

1. A method comprising:
    creating a first layer of a composite structure, wherein the first layer forms an exterior surface of a housing of a portable electronic device, the exterior surface having a cosmetic finish, and wherein creating the first layer comprises:
    positioning a first side of the first layer in a first mold;
    applying a first peel ply to a second side of the first layer, the second side of the first layer being opposite the first side of the first layer; and
    curing the first layer with heat and pressure to provide the cosmetic finish to the first side of the first layer;
    creating a second layer of the composite structure, wherein a first side of the second layer forms an interior surface of the housing that is opposite to the exterior surface and oriented toward the inside of the housing, and wherein creating the second layer comprises:
    positioning the first side of the second layer in a second mold;
    applying a second peel ply to a second side of the second layer; and curing the second layer with heat and pressure, the second side of the second layer being opposite the first side of the second layer;
    removing the first peel ply to expose a first bonding surface of the first layer; removing the second peel ply to expose a second bonding surface of the second layer; and
    bonding the first bonding surface of the first layer to the second bonding surface of the second layer to form at least a portion of the housing of the portable electronic device.

2. The method of claim 1, wherein the first layer is formed using a first curing process and the second layer is formed using a second curing process that is different than the first curing process.

3. The method of claim 1, further comprising applying an adhesive material to the first layer prior to bonding the first layer to the second layer.

4. The method of claim 3, wherein the adhesive material comprises at least one of a film adhesive, a contact cement, and a liquid adhesive.

5. The method of claim 1, further comprising positioning a woven fabric over the first layer prior to applying the first peel ply layer and curing the first layer.

6. A method of manufacturing a housing of a portable computing device, the method comprising:
    coupling a woven fabric to a first ply, wherein a first side of the first ply is positioned in a first mold and wherein the woven fabric is coupled to a second side of the first ply opposite to the first side;
    positioning a first peel ply over the woven fabric;
    curing the first ply in the first mold;
    removing the first peel ply to expose a bonding surface on the second side of the first ply;
    curing one or more additional plies in a second mold, the one or more additional plies having a first side coupled to a second peel ply and a second side opposite to the first side;
    removing the second peel ply; and
    bonding the second side of the first ply with the first side of the one or more additional plies to form at least a portion of a housing of the portable computing device;
    wherein the first side of the first ply forms an exterior surface of the housing of the portable computing device and has a cosmetic finish; and
    wherein the first side of the one or more additional plies forms an interior surface opposite to the exterior surface of the housing of the portable computing device.

7. The method of claim 6, further comprising:
    cutting out an area of the one or more additional plies; and inserting a window into the cutout area.

8. The method of claim 6, further comprising:
    applying a first temperature and pressure to the first ply to cure the first ply; and
    applying a second temperature and pressure to the one or more additional plies to cure the one or more additional plies, wherein the second temperature and pressure differs from the first temperature and pressure.

9. The method of claim 6, further comprising applying an adhesive to the bonding surface.

10. The method of claim 9, wherein the adhesive comprises at least one of a film adhesive, a contact cement, and a liquid adhesive.

11. The method of claim 6, wherein the one or more additional plies form a backing of the composite structure.

12. The method of claim 6, wherein the first ply comprises a pre-impregnated fiber material.

13. The method of claim 12, wherein each impregnated fiber of the pre-impregnated fiber material extends along a same axis.

14. The method of claim 6, wherein the woven fabric comprises a glass fiber.

15. A method for manufacturing a housing of a portable computing device, the method comprising:
positioning a first side of a first ply in a first mold;
applying a first peel ply to a second side of the first ply, the second side of the first ply being opposite the first side of the first ply;
curing the first ply in the first mold to create an exterior surface of the housing of the portable computing device on the first side of the first ply, the exterior surface having a cosmetic finish;
curing one or more additional plies in a second mold having a first side coupled to a second peel ply and a second side opposite to the first side;
removing the first peel ply and the second peel ply; and
bonding the second side of the first ply to the one or more additional plies to form at least a portion of the housing of the portable computing device, wherein the second side of the one or more additional plies form an interior surface opposite to the exterior surface of the housing.

16. The method of claim 15, wherein curing the first ply comprises applying a first temperature and a first pressure to the first ply.

17. The method of claim 16, wherein curing the one or more additional plies comprises applying a second temperature and a second pressure to the one or more additional plies, wherein the second temperature and the second pressure differ from the first temperature and the first pressure.

18. The method of claim 15, wherein the one or more additional plies form a backing for the surface of the housing of the portable computing device.

19. The method of claim 15, wherein the first ply comprises a pre-impregnated fiber material.

20. The method of claim 19, wherein each impregnated fiber of the pre-impregnated fiber material extends along a same axis.

* * * * *